United States Patent [19]

Huffman

[11] Patent Number: 5,340,553
[45] Date of Patent: Aug. 23, 1994

[54] METHOD OF REMOVING OXYGEN FROM A CONTROLLED ATMOSPHERE

[75] Inventor: James E. Huffman, Fullerton, Calif.

[73] Assignee: Rockwell International Corporation, Seal Beach, Calif.

[21] Appl. No.: 36,007

[22] Filed: Mar. 22, 1993

[51] Int. Cl.$^5$ .............................................. C01B 13/00
[52] U.S. Cl. ................... 423/219; 423/579; 423/580.1; 502/3; 502/407; 252/181.5; 252/194; 252/181.6
[58] Field of Search ......... 423/219, 579, 580; 502/3, 407; 437/238; 34/32, 80, 81; 252/181.5, 194, 181.6

[56] References Cited

U.S. PATENT DOCUMENTS

| | | | |
|---|---|---|---|
| 2,469,435 | 5/1949 | Hirsch | 252/194 |
| 3,241,217 | 3/1966 | Nunn | 252/194 |
| 3,704,806 | 12/1972 | Plachenov et al. | 252/194 |
| 4,081,397 | 3/1978 | Booe | 252/194 |
| 4,516,984 | 5/1985 | Warner et al. | 55/16 |
| 4,563,368 | 1/1986 | Tihanyi et al. | 427/82 |
| 4,906,595 | 3/1990 | van der Plas et al. | 437/239 |
| 5,135,548 | 8/1992 | Golden et al. | 55/25 |

FOREIGN PATENT DOCUMENTS

| | | | |
|---|---|---|---|
| 3835825 | 3/1990 | Fed. Rep. of Germany | 423/219 |
| 286689 | 1/1991 | Fed. Rep. of Germany | 252/194 |
| 235259 | 9/1989 | Japan | 437/238 |
| 4-30518 | 2/1992 | Japan | 437/238 |

OTHER PUBLICATIONS

"Vapor Deposition of Silicon Dioxide" by D K Seto et al; IBM Technical Disclosure Bulletin vol. 9 No. 7 Dec. 1966.

Primary Examiner—Gary P. Straub
Assistant Examiner—Timothy C. Vanoy
Attorney, Agent, or Firm—John C. McFarren

[57] ABSTRACT

A method is provided for removing residual amounts of oxygen and water vapor from the controlled atmosphere of an enclosed chamber. A small volume of high-purity silicon is heated in a crucible placed inside the chamber. The silicon is typically heated with a power source separate from that used for heating the chamber and its primary contents. The heated silicon functions as an effective oxygen getter for removing residual oxygen and water vapor from the controlled atmosphere before and/or during a process conducted in the chamber. Heating the silicon to a molten state can induce beneficial convective stirring that keeps the silicon surface fresh for effective, efficient, and continuous capturing of oxygen.

11 Claims, 1 Drawing Sheet

METHOD OF REMOVING OXYGEN FROM A CONTROLLED ATMOSPHERE

TECHNICAL FIELD

The present invention relates to methods of removing residual oxygen from controlled atmospheres and, in particular, to a method of using heated silicon as an oxygen getter to remove residual oxygen and water vapor from the atmosphere of a semiconductor growth chamber.

BACKGROUND OF THE INVENTION

Many chemical processes require a carefully controlled atmosphere or vacuum as a necessary condition. Semiconductor fabrication processes, for example, often require the absence of oxygen and water vapor in the growth chamber. As a specific example, the crystalline quality of silicon or silicon-germanium is limited by the presence of even small concentrations or partial pressures of oxygen and/or water vapor in the growth chamber. At temperatures of up to about 900° C., where specialized semiconductor devices are prepared using current technology, the surface of silicon readily captures oxygen. Oxygen contamination of silicon surfaces, however, makes epitaxial growth very difficult and causes undesirable oxygen-related point defects in the semiconductor structure. Bulk float zone growth of silicon can also suffer from oxygen contamination, which can lead to defects and thermal donors that may cause undesirable effects. Therefore, a method is needed for effectively removing residual oxygen and water vapor from a semiconductor growth chamber without introducing other potentially contaminating materials.

SUMMARY OF THE INVENTION

The present invention is a method of removing residual amounts of oxygen and water vapor from the controlled atmosphere of an enclosed chamber. The controlled atmosphere, such as that provided in a semiconductor growth chamber, may comprise a vacuum or an atmosphere having a specific gas content, for example. A small volume charge of high-purity silicon is heated in a crucible, such as a silicon carbide coated graphite cup, for example, placed inside the semiconductor growth chamber. The chamber is typically purged of contaminants, such as oxygen and water vapor, for example, using conventional procedures to establish a controlled atmosphere. The silicon charge is heated (preferably using radio frequency (RF) induction or radiant heating, for example) using a power source that typically is separate from that used for heating the chamber and its primary contents. The heated silicon functions as an effective oxygen getter that may be used before and/or during the growth of semiconductor material to remove residual oxygen and water vapor from the controlled atmosphere of the chamber. Although not required, heating the silicon charge to a molten state can cause beneficial convective stirring that keeps the silicon surface fresh for more effective and efficient capturing of oxygen.

A principal object of the invention is an effective method of removing residual amounts of oxygen and water vapor from the controlled atmosphere of an enclosed chamber. A feature of the invention is the use of a separate charge of heated silicon in the chamber as an oxygen getter. An advantage of the invention is the effective removal of residual amounts of oxygen and water vapor without introducing other contaminating elements into a semiconductor growth chamber.

BRIEF DESCRIPTION OF THE DRAWINGS

For a more complete understanding of the present invention and for further advantages thereof, the following Detailed Description of the Invention makes reference to the accompanying Drawings, in which.

DETAILED DESCRIPTION OF THE INVENTION

Figure 1:
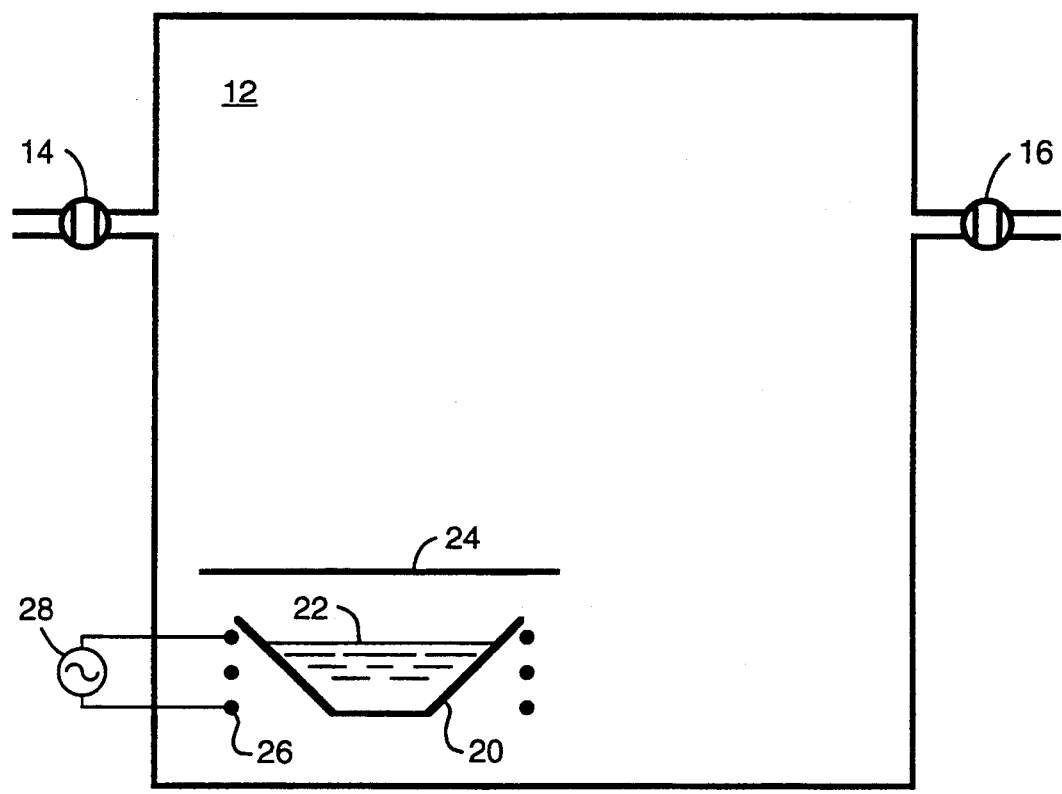
FIG. 1 is a schematic illustration of the method of the present invention using a heated silicon charge as an oxygen getter in a chamber having a controlled atmosphere.

The present invention comprises a method of removing residual amounts of oxygen and water vapor from an enclosure, such as a semiconductor growth chamber, that has a controlled atmosphere. The controlled atmosphere may comprise a vacuum or a specific gas content at a controlled pressure, for example. FIG. 1 is a schematic diagram illustrating a basic apparatus for practicing the method of the invention.

In FIG. 1, chamber 12 comprises an enclosure for containing a controlled atmosphere, such as that necessary for fabricating high quality semiconductor devices. Chamber 12 typically includes an inlet valve 14 and an outlet or exhaust valve 16. In processes requiring a controlled atmosphere, chamber 12 is generally either evacuated or flushed with a flow of an inert gas to purge contaminants such as oxygen and water vapor, for example, from the atmosphere of chamber 12. However, in processes such as the growth of silicon or silicon-germanium epitaxial layers or bulk material, even small amounts of residual oxygen or water vapor in chamber 12 can be detrimental to the crystalline quality and the electronic or optical properties of the grown semiconductor material. This is particularly true for growth of silicon and silicon-germanium epitaxial layers at temperatures up to approximately 900° C.

As illustrated in FIG. 1, a crucible 20, comprising a material that does not react with heated silicon, is placed inside chamber 12. Crucible 20 may comprise a silicon carbide coated graphite cup, for example. Crucible 20 contains a small volume (on the order of a few cubic centimeters, for example) of high-purity silicon 22. Low oxygen content (e.g., float zone prepared) silicon comprises a preferred silicon charge because it absorbs more than $10^{18}$ oxygen atoms per cubic centimeter of silicon volume. Crucible 20 is surrounded by radio frequency (RF) inductive heating coils 26, which are connected to a power supply 28, for heating silicon 22. Alternative energy sources, such as radiant or electrical energy for example, which are well known in the art, may also be used for heating silicon 22 in crucible 20. RF heating coils 26 may be placed inside (as illustrated) or outside chamber 12. RF heating coils 26 placed inside chamber 12 may be coated with silver or any other inert coating material that is compatible with the particular semiconductor growth or other process conducted within chamber 12. Power supply 28 is generally separate from the source of energy (not shown) used for heating chamber 12 and/or its primary contents during a process such as growth of semiconductor material, for example. When heated, silicon 22 becomes an effective oxygen getter that may be used before and/or during a process such as the growth of semiconductor material to remove residual oxygen and water vapor from the controlled atmosphere of chamber 12. By way of example, and not limitation, silicon 22 is effective as an oxygen getter when heated to within the range of about 1000°–1500° C. Heating to lower temperatures may still be effective, but less efficient. Although silicon 22 does not need to be heated to melting, heating to the molten state, preferably by RF induction heating, can induce convective stirring of silicon 22 in crucible 20, which keeps the surface of silicon 22 fresh for efficient and continuous capturing of residual oxygen and water vapor from the atmosphere of chamber 12. A plate 24, which may be cooled using well known techniques, may be placed above crucible 20 to minimize any evaporation of silicon 22 into chamber 12. A significant advantage of using a separate charge of silicon 22 as an oxygen getter in a semiconductor growth process involving silicon or silicon-based materials is that silicon 22 does not introduce additional elements into chamber 12 that would contaminate the semiconductor materials being fabricated. Furthermore, the method of the present invention is effective for processes where intentional doping of silicon is desired.

Although the present invention has been described with respect to specific embodiments thereof, various changes and modifications can be carried out by those skilled in the art without departing from the scope of the invention. Therefore, it is intended that the present invention encompass such changes and modifications as fall within the scope of the appended claims.

I claim:

1. A method of removing residual oxygen from the atmosphere of an enclosed chamber, comprising the steps of:
   placing a charge of silicon inside the chamber;
   purging oxygen from the atmosphere of the chamber;
   heating said silicon to a molten state; and
   said heated silicon acting as an oxygen getter to remove residual oxygen from the atmosphere of the enclosed chamber.

2. The method of claim 1, wherein the step of placing said silicon comprises placing said silicon in a crucible comprising material that does not react with said heated silicon.

3. The method of claim 2, wherein the step of placing said silicon in a crucible comprises placing said silicon in a silicon carbide coated graphite cup.

4. The method of claim 3, wherein the step of heating said silicon comprises heating said silicon with inductive heating coils surrounding said silicon carbide coated graphite cup.

5. A method of removing residual oxygen and water vapor from the atmosphere of an enclosed chamber, comprising the steps of:
   placing a charge of silicon in a crucible;
   placing said crucible containing said silicon inside the chamber;
   purging oxygen and water vapor from the atmosphere of the chamber;
   heating said silicon to a molten state; and
   said heated silicon acting as an oxygen getter to remove residual oxygen and water vapor from the atmosphere of the enclosed chamber.

6. The method of claim 5, wherein the step of placing said silicon comprises placing said silicon in a crucible comprising material that does not react with said molten silicon.

7. The method of claim 6, wherein the step of placing said charge of silicon in said crucible comprises placing said silicon in a silicon carbide coated graphite cup.

8. The method of claim 7, wherein the step of heating said silicon comprises heating said silicon with inductive heating coils surrounding said silicon carbide coated graphite cup.

9. A method of removing residual oxygen and water vapor from the atmosphere of an enclosed semiconductor growth chamber, comprising the steps of:
   placing a charge of high purity silicon in a crucible comprising material that does not react with heated silicon;
   placing said crucible containing said silicon inside the chamber;
   purging oxygen and water vapor from the atmosphere of the chamber;
   heating said silicon to a molten state to act as an oxygen getter; and
   said heated silicon capturing residual oxygen and water vapor from the atmosphere of the enclosed chamber.

10. The method of claim 9, wherein the step of placing said charge of silicon in said crucible comprises placing said silicon in a silicon carbide coated graphite cup.

11. The method of claim 10, wherein the step of heating said silicon comprises heating said silicon with inductive heating coils surrounding said silicon carbide coated graphite cup.

* * * * *